(12) United States Patent
Simonazzi

(10) Patent No.: US 11,870,286 B2
(45) Date of Patent: Jan. 9, 2024

(54) BATTERY CHARGER FOR ELECTRIC OR HYBRID MOTOR VEHICLES

(71) Applicant: META SYSTEM S.p.A., Reggio Emilia (IT)

(72) Inventor: Giuseppe Simonazzi, Reggio Emilia (IT)

(73) Assignee: META SYSTEM S.p.A., Reggio Emilia (IT)

( * ) Notice: Subject to any disclaimer, the term of this patent is extended or adjusted under 35 U.S.C. 154(b) by 234 days.

(21) Appl. No.: 17/261,806

(22) PCT Filed: Jul. 16, 2019

(86) PCT No.: PCT/IB2019/056048
§ 371 (c)(1),
(2) Date: Jan. 20, 2021

(87) PCT Pub. No.: WO2020/016764
PCT Pub. Date: Jan. 23, 2020

(65) Prior Publication Data
US 2021/0281089 A1 Sep. 9, 2021

(30) Foreign Application Priority Data

Jul. 20, 2018 (IT) .......................... 102018000007391

(51) Int. Cl.
*H02J 7/00* (2006.01)
*B60L 53/16* (2019.01)
(Continued)

(52) U.S. Cl.
CPC ............ *H02J 7/0042* (2013.01); *B60L 53/16* (2019.02); *B60L 53/18* (2019.02); *H01R 4/305* (2013.01); *H01R 11/12* (2013.01); *H01R 4/184* (2013.01)

(58) Field of Classification Search
CPC .............................. H02J 7/0042; B60L 53/16
(Continued)

(56) References Cited

U.S. PATENT DOCUMENTS

2012/0286729 A1* 11/2012 Yegin .................... B60L 3/0069
320/109
2015/0180181 A1* 6/2015 Loncar ............... H01R 13/6275
439/578

(Continued)

FOREIGN PATENT DOCUMENTS

EP          1 266 801 A2    12/2002
FR          2 982 094 A1     5/2013
(Continued)

*Primary Examiner* — Suchin Parihar
(74) *Attorney, Agent, or Firm* — ASLAN LAW, P.C.

(57) ABSTRACT

A battery charger for electric or hybrid motor vehicles including one container body installable on a motor vehicle and defining one housing compartment, the container body comprises one grounding connector to be connected to one grounding electrical potential by one electrical grounding cable, and one electronic appliance housed inside the housing compartment, connectable to one electric battery of the motor vehicle and configured to recharge the battery, wherein the connector comprises a retaining device/structure/unit/component of the electrical grounding cable adapted to block the position thereof.

13 Claims, 4 Drawing Sheets

(51) Int. Cl.
*B60L 53/18* (2019.01)
*H01R 4/30* (2006.01)
*H01R 11/12* (2006.01)
*H01R 4/18* (2006.01)

(58) Field of Classification Search
USPC .......................................................... 320/109
See application file for complete search history.

(56) References Cited

U.S. PATENT DOCUMENTS

2017/0313402 A1* 11/2017 Flores ........................ B64C 1/36
2018/0097306 A1* 4/2018 Hirasawa .............. H01R 13/115
2020/0164755 A1* 5/2020 Smolenaers ............ H02J 3/322
2022/0336970 A1* 10/2022 Nagayama ............. H01R 13/50

FOREIGN PATENT DOCUMENTS

| FR | 3 039 354 A1 | 1/2017 |
| JP | 2010 198856 A | 9/2010 |
| WO | WO 2013/011626 A1 | 1/2013 |

* cited by examiner

BATTERY CHARGER FOR ELECTRIC OR HYBRID MOTOR VEHICLES

CROSS-REFERENCE TO RELATED APPLICATIONS

This application is a National Stage Entry of PCT/IB2019/056048 filed on Jul. 16, 2019. This application claims priority to IT Patent Application No. 102018000007391 filed on Jul. 20, 2018, and to PCT Application No. PCT/IB2019/056048 filed on Jul. 16, 2019, the entire contents of which are hereby incorporated by reference.

TECHNICAL FIELD

The present invention relates to a battery charger for electric or hybrid motor vehicles.

BACKGROUND ART

A number of battery chargers for electric or hybrid motor vehicles are known which are used to charge the electrical batteries generally fitted to such motor vehicles in order to power various electronic devices, such as e.g. the engine, the control unit, the lights and the like.

In particular, the battery chargers of this type are provided with an electronic appliance for the recharge of the batteries, and with a container body of the electronic appliance itself which aims to protect and facilitate the installation of the latter inside the motor vehicle.

In addition, the container bodies of this type are generally made of metal material in order to give particular resistance to the container body and to shield, at the same time, the electronic appliance from any electromagnetic interference that could adversely affect the operation of the electronic appliance. For safety reasons, the container bodies of this type, however, must be electrically connected to the electrical ground potential by means of a suitable electrical grounding cable.

This way, if the container body is accidentally energized, for example as a result of a failure of the electronic appliance, the electrical grounding cable discharges the voltage, which otherwise could be dangerous for a user who should touch the container body.

Known container bodies, in fact, generally comprise at least one grounding connector that can be electrically connected to the ground potential by means of the electrical grounding cable.

In particular, the grounding connector generally comprises a connecting element to which the electrical grounding cable is electrically connected and mechanically fixed.

Generally, the connecting element comprises a screw made integral with the connector and to which the electrical grounding cable is connected by means of a special electrical terminal.

In addition, the connecting element comprises a nut that, after being screwed to the screw, mechanically fixes the electrical terminal, and then the cable, to the screw itself.

The battery chargers of this type are however subject to improvement due to the connection of the electrical grounding cable to the grounding connector.

During the fixing of the electrical terminal to the connecting element, the electrical grounding cable is free to move, e.g. due to the friction exerted on the terminal by the clamping nut which is screwed along the clamping screw.

For this reason, a specialized operator who has the task of fixing the electrical grounding cable to the clamping screw must also make sure to manually retain the cable itself which, during screwing of the clamping nut, could be unintentionally moved, thus risking to become damaged, for example by colliding with other components of the battery charger.

In addition, this manual retention operation by the operator significantly increases the installation time of the battery charger.

DESCRIPTION OF THE INVENTION

The main aim of the present invention is to devise a battery charger for electric or hybrid motor vehicles that allows easily connecting the grounding connector to the electrical grounding cable without any need to manually retain the latter. A further object of the present invention is to devise a battery charger that retains the grounding cable in a safe manner without the risk of damaging it. Another object of the present invention is to devise a battery charger for electric or hybrid motor vehicles that allows overcoming the mentioned drawbacks of the prior art within a simple, rational, easy, effective to use and low cost solution.

The above mentioned objects are achieved by the present battery charger for electric or hybrid motor vehicles having the characteristics of claim 1.

BRIEF DESCRIPTION OF THE DRAWINGS

Other characteristics and advantages of the present invention will be more evident from the description of a preferred, but not exclusive, embodiment of a battery charger for electric or hybrid motor vehicles, illustrated by way of an indicative, but not limited example, in the attached tables of drawings wherein.

EMBODIMENTS OF THE INVENTION

Figure 1:
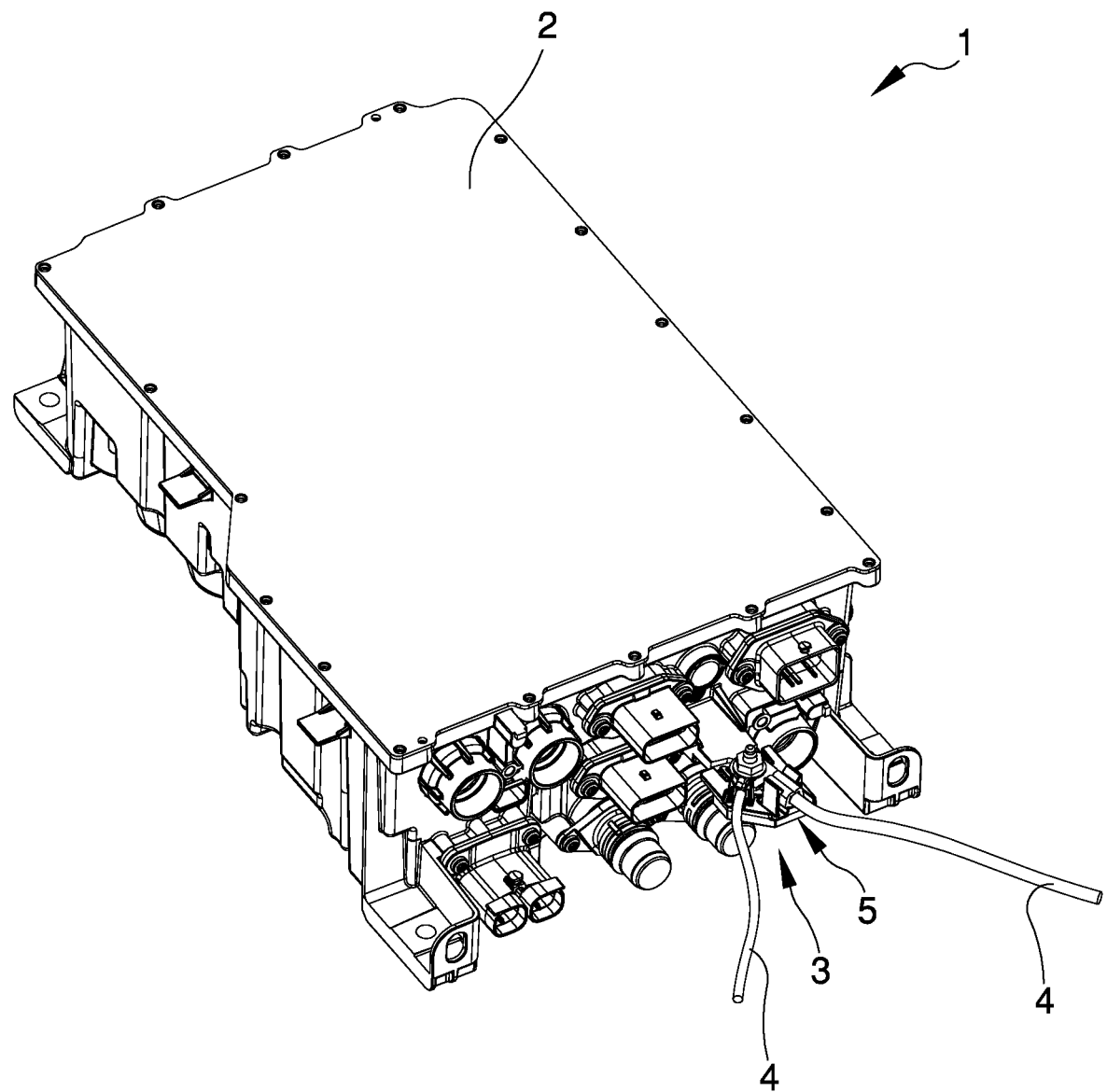
FIG. 1 is an axonometric view of the battery charger according to the invention.

With particular reference to these illustrations, reference numeral 1 globally indicates a battery charger for electric or hybrid motor vehicles.

The battery charger 1 for electric or hybrid motor vehicles comprises:

- at least one container body 2 installable on a motor vehicle and defining at least one housing compartment, the container body 2 comprising at least one grounding connector 3 to be connected to at least one grounding electrical potential by means of at least one electrical grounding cable 4;
- at least one electronic appliance housed inside the housing compartment, connectable to at least one electrical battery of the motor vehicle and configured to recharge the battery.

In particular, the connector 3 comprises retaining means 5 of the electrical grounding cable 4 which are adapted to block the position thereof. Preferably, the connector 3 is an elongated body which extends to the outside of the container body 2 and which has the retaining means 5 at the terminal end thereof, as shown in FIG. 1.

More in detail the retaining means 5 comprise elastic locking means 6a, 6b of the electrical grounding cable 4.

With particular reference to the embodiment shown in the figures, the retaining means 5 comprise a plurality of elastic locking means 6a, 6b adapted to fix the position of a plurality of electrical grounding cables 4.

Preferably, the retaining means 5 comprise a first elastic locking means 6a which fixes the position of a first electrical grounding cable 4 and a second elastic locking means 6b which fixes the position of a second electrical grounding cable 4.

Alternative embodiments cannot however be ruled out wherein the retaining means 5 comprise a different number of elastic locking means 6a, 6b.

Preferably, the retaining means 5 comprise a substantially plate-shaped supporting body 11 on which the elastic locking means 6a, 6b are made. Advantageously, the elastic locking means 6a, 6b comprise at least one pair of elastic elements 7 arranged substantially opposed to each other to define at least one clamping mouth 8 and elastically deformable away from each other to allow the insertion of the electrical cable 4 inside the clamping mouth 8, the elastic elements 7 coming to approach each other elastically to prevent the electrical cable 4 from coming out of the clamping mouth 8.

In particular, the elastic element 7 comprises at least one elongated portion 9 and at least one extremal locking portion 10 associated with the elongated portion 9 and arranged protruding towards the inside of the clamping mouth 8. In addition, the extremal portions 10 of the pair of elastic elements 7 are arranged substantially opposed to each other extending the one towards the other, and interlocking the electrical cable 4 after that the same is inserted in the clamping mouth 8.

Preferably, the elongated portions 9 are two flat bodies associated with the supporting body 11 and arranged substantially orthogonal to the latter so as to delimit therewith a clamping mouth 8 having a substantially "U"-shaped section.

Furthermore, the elongated portions 9 are spaced away to each other by a distance substantially equal to the diameter of the electrical cable 4, so as to allow the housing of the latter inside the clamping mouth 8.

Figure 2:
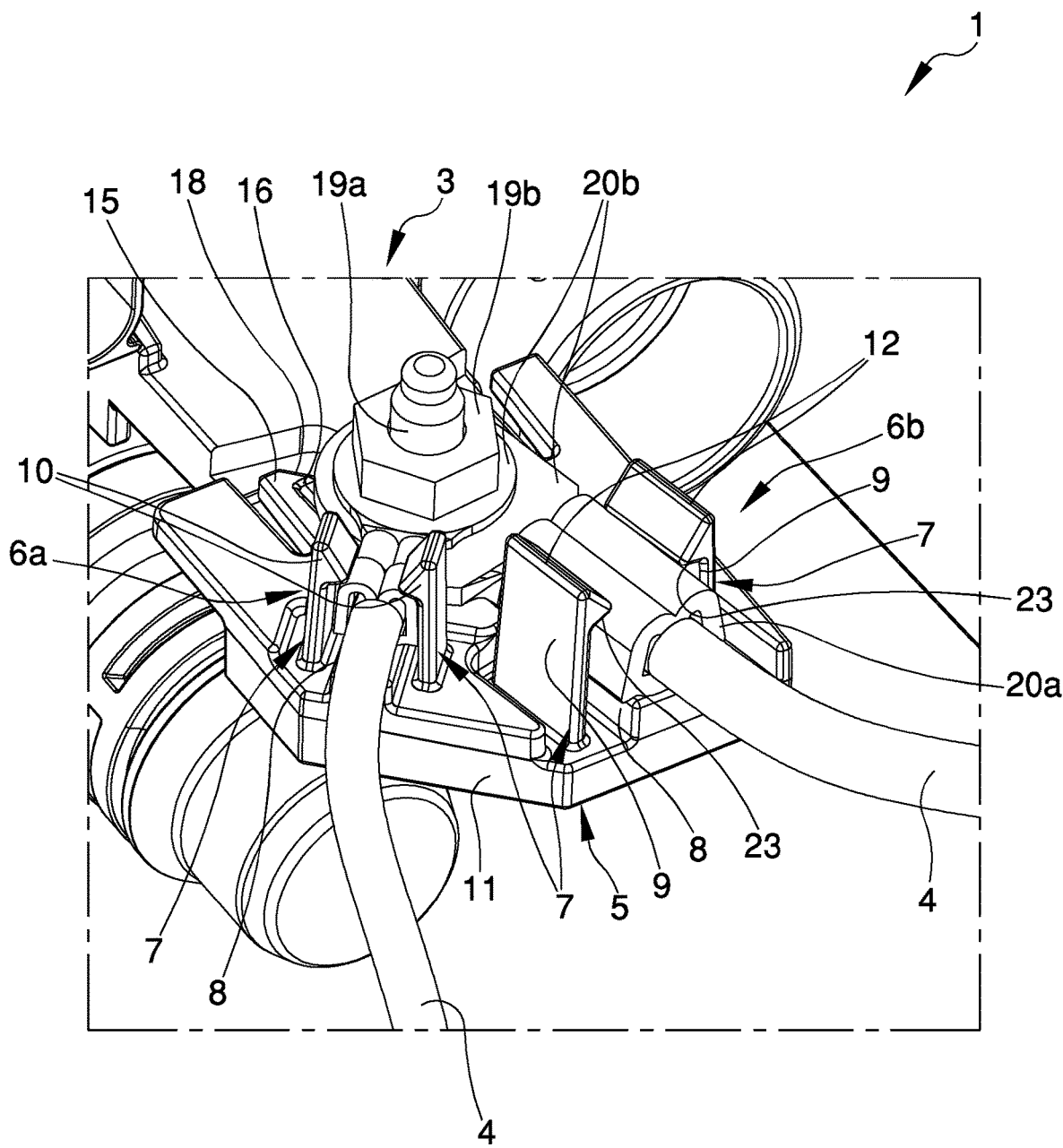
FIG. 2 is an axonometric view of several elements of the battery charger according to the invention.

The extremal portion 10, on the other hand, is preferably a body protruding towards the inside of the clamping mouth 8 and associated with a relevant elastic element 7 at the point that moves furthest from the supporting body 11, as shown in FIG. 2.

In particular, the extremal portion 10 comprises at least one inclined surface 12 converging towards the inside of the clamping mouth 8 defining the opening thereof.

Moreover, the inclined surface 12 is adapted to be pressed so as to facilitate the insertion of the electrical grounding cable 4 inside the clamping mouth 8 and in such a way as to cause the elastic deformation of the elastic elements 7.

Advantageously, the inclined surface 12 can be pressed by the electrical cable 4 during the insertion thereof inside the clamping mouth 8.

In particular, the inclined surfaces 12 of the elastic elements 7 define an opening with narrower section than the section of the clamping mouth 8, as shown in FIG. 2.

In other words, the inclined surfaces 12 substantially define a bottleneck of the clamping mouth 8.

Preferably, the inclined surfaces 12 are arranged inclined starting from the corresponding elastic element 7 and converging towards the supporting body 11, in order to define a guide adapted to facilitate the sliding of the electrical cable 4 inside the clamping mouth 8.

Advantageously, the extremal portion 10 comprises at least one abutment surface 23 facing towards the inside of the clamping mouth 8 and adapted to abut against the electrical cable 4 housed inside the clamping mouth 8, preventing this from coming out.

Preferably, the abutment surface 23 is arranged substantially parallel to the supporting body 11.

According to the embodiment shown in the illustrations, the abutment surface 23 and the inclined surface 12 are contiguous to each other to form an extremal portion 10 of substantially saw-tooth shape.

Advantageously, at least one of the elastic locking means 6a, 6b defines a clamping mouth 8 of greater or smaller size than the clamping mouth 8 defined by other elastic locking means 6a, 6b so as to lock the electrical grounding cables 4 of greater or smaller size, respectively.

In particular, the first elastic locking means 6a is provided with a pair of smaller elastic elements 7 than the pair of elastic elements 7 of the second elastic locking means 6b, so as to block a smaller electrical grounding cable 4.

With particular reference to the embodiment shown in the illustrations, the elastic elements 7 of the first elastic locking means 6a are arranged at a shorter distance from each other than the mutual distance where the elastic elements 7 of the second elastic locking means 6b are positioned.

Furthermore, the elastic elements 7 of the first elastic locking means 6a are less high than the elastic elements 7 of the second elastic locking means 6b.

In other words, the elastic elements 7 of the first elastic locking means 6a extend from the supporting body 11 by a shorter distance than the elastic elements 7 of the second elastic locking means 6b.

In this way, the first elastic locking means 6a can retain an electrical cable 4 which, given its size, would not be retained by the abutment surfaces 23 of the elastic elements 7 of the second elastic locking means 6b.

Advantageously, the battery charger comprises removable attachment means 13, 14 of the retaining means 5 to the connector 3.

In particular, the attachment means 13, 14 comprise at least one interlocking body 13 made on one of the connector 3 and the retaining means 5, and at least one interlocking groove 14 made on the other of the connector 3 and the retaining means 5 which is adapted to mate by interlocking with the interlocking body 13.

Preferably, the interlocking groove 14 is made on the supporting body 11 of the retaining means 5 and the interlocking body 13 is made on the connector 3.

Alternative embodiments of the battery charger 1 cannot however be ruled out wherein the interlocking groove 14 is made on the connector 3 and the interlocking body 13 is made on the supporting body 11.

Advantageously, the interlocking groove 14 comprises at least one pair of elastic bodies 15 arranged substantially opposed to each other and elastically deformable away from each other to allow the interlocking of the interlocking body 13 inside the interlocking groove 14, the elastic bodies 15 coming to approach each other elastically to prevent the interlocking body 13 from coming out of the interlocking groove 14.

As shown in the embodiment in the illustrations, the elastic bodies 15 have a substantially elongated shape and extend laterally to the supporting body 11 along a direction of extension substantially orthogonal with respect to the direction of extension of the elastic elements 7.

Furthermore, the elastic bodies 15 comprise a block portion 16 which extends inside the interlocking groove 14, and the interlocking body 13 comprises a pair of substantially opposed block slots 17 which are adapted to accommodate the block portions 16.

Conveniently, the elastic bodies 15 comprise at least one guiding portion 18 which is adapted to abut against the interlocking body 13 when the latter is inserted inside the interlocking groove 14.

In fact, when the interlocking body 13 is inserted inside the interlocking groove 14, it divides the elastic bodies 15 by deforming them elastically and slides in contact with the block portions 16 until the latter are arranged at the block slots 17 to which they are attached thanks to the elastic return of the elastic bodies 15 which push the block portions 16 inside the corresponding block slots 17.

This way, the retaining means 5 can be easily attached to/released from the connector 3, for example to be replaced with the retaining means 5 provided with elastic locking means 6a, 6b defining clamping mouths 8 with different dimensions.

Advantageously, the connector 3 comprises at least one electrical connecting element 19a, 19b of the electrical grounding cable 4 and at least one connecting terminal 20a, 20b, which can be coupled in a removable manner to the connecting element 19a, 19b and electrically associable with the electrical grounding cable 4, the connecting terminal 20a, 20b being fixed by the elastic locking means 6a, 6b to lock the movement of the electrical grounding cable 4. Advantageously, the connecting element 19a, 19b comprises a threaded body 19a and a nut screw body 19b that can be screwed to the threaded body 19a to fix the connecting terminal 20a, 20b thereto.

In particular, the connecting terminal 20a, 20b is preferably an electrically conductive tip.

Furthermore, the connecting terminal 20a, 20b is provided with a first fixing end 20a fixed to the electrical grounding cable 4, and a second fixing end 20b fixed to the threaded body 19a.

Preferably, the first fixing end 20a is a clamp mechanically fixed to the conductor wire or wires of the electrical cable 4, e.g. by means of a crimping tool, and the second fixing end 20b is a clamping ring fitted along the threaded body 19a.

In this way, after the clamping ring has been fitted along the threaded body 19a, the nut screw body 19b is screwed along the threaded body itself and locks the position of the clamping ring.

Figure 3:
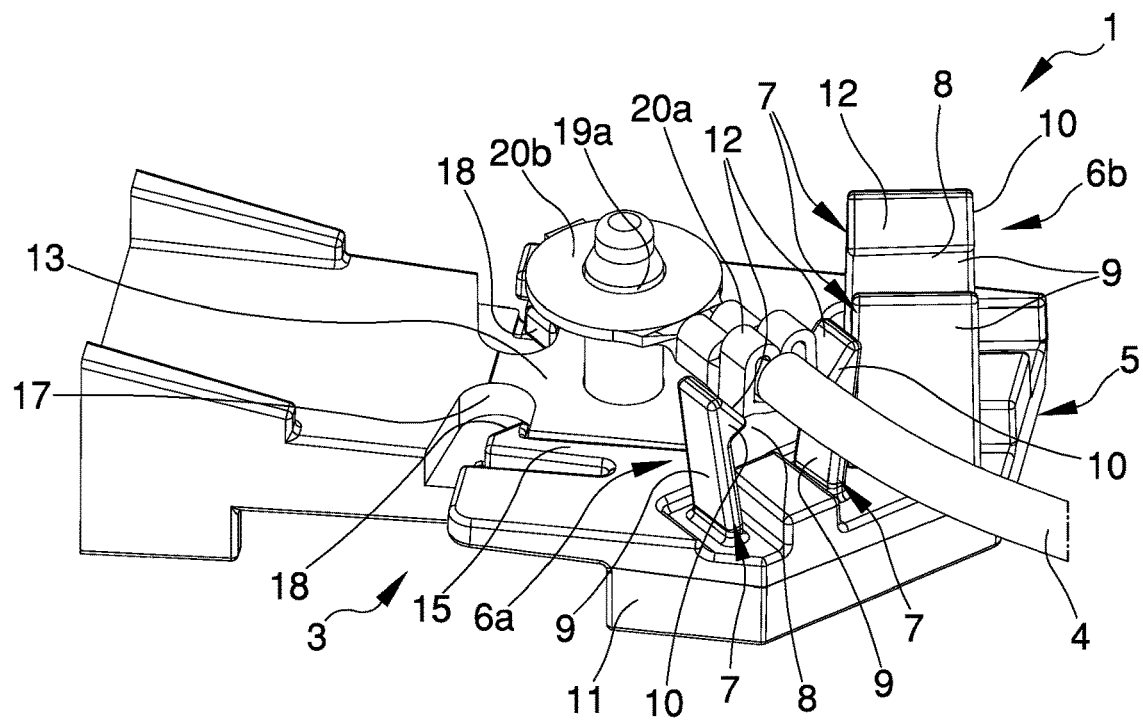
FIG. 3 and FIG. 4 are two axonometric views showing the grounding steps of the battery charger according to the invention.
Figure 4:
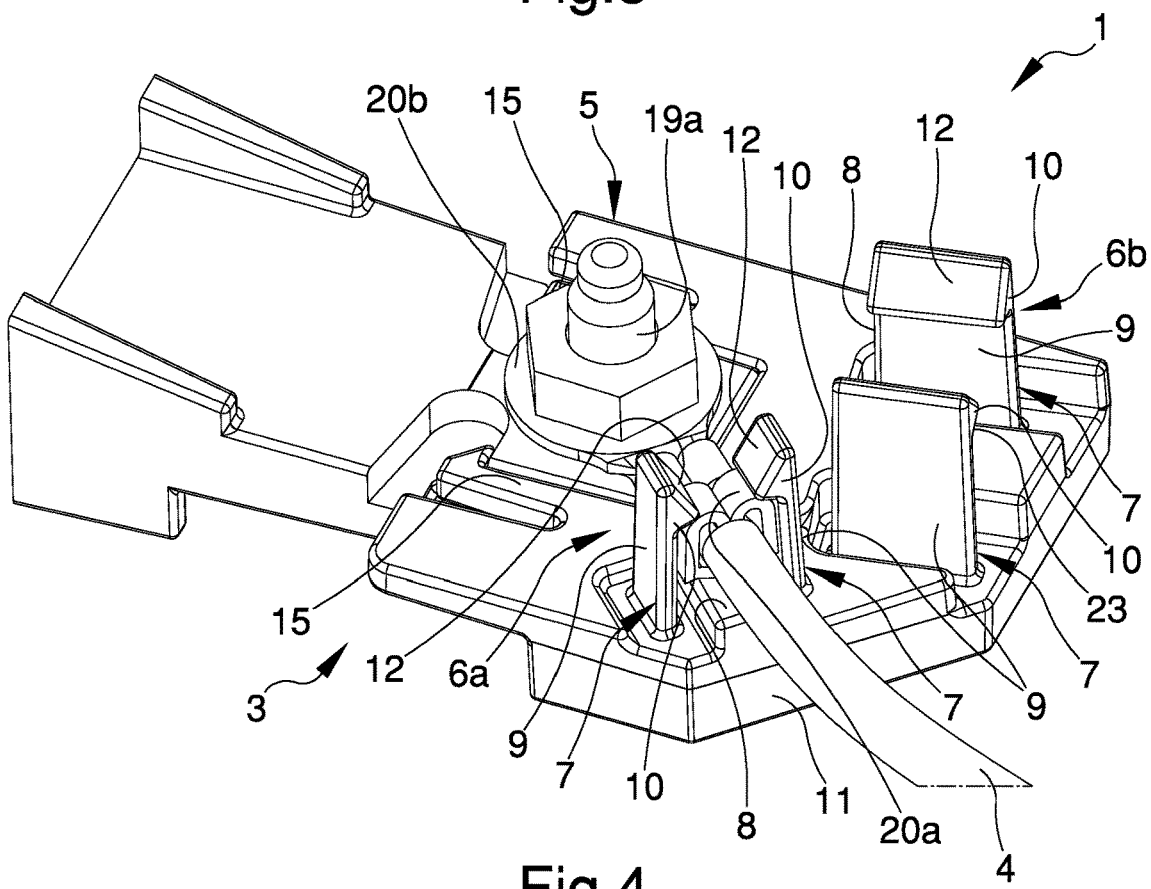

Conveniently, as shown in FIGS. 3 and 4, the connecting terminal 20a, 20b is fitted inside the clamping mouth 8 between the elastic elements 7.

In this way, the elastic elements 7 abut against the connecting terminal 20a, 20b to fix the position of the electrical cable 4 and not the body of the electrical cable 4, which could otherwise become damaged against the elastic elements themselves.

In this way, the movement of the electrical cable 4 is prevented by blocking the connecting terminal 20a, 20b.

In particular, the first fixing end 20a is blocked inside the clamping mouth 8 and at the same time the clamping ring is blocked by the connecting element 19a, 19b.

Conveniently, the battery charger 1 comprises removable fixing means 21, 22 of the connecting element 19a, 19b to the connector 3.

In particular, the fixing means 21, 22 comprise:
at least one through hole 21 made on at least one of the connector 3 and the retaining means 5, the connecting element 19a, 19b being inserted inside the through hole 21;
at least one supporting element 22 made on the other of the connector 3 and the retaining means 5 and adapted to support the connecting element 19a, 19b inserted inside the through hole 21, the supporting element 22 preventing the connecting element 19a, 19b from coming out of the through hole 21 when the retaining means 5 are fixed to the connector 3 through the attachment means 13, 14.

Preferably, the through hole 21 is of the threaded type and passes through the body of the connector 3.

Figure 5:
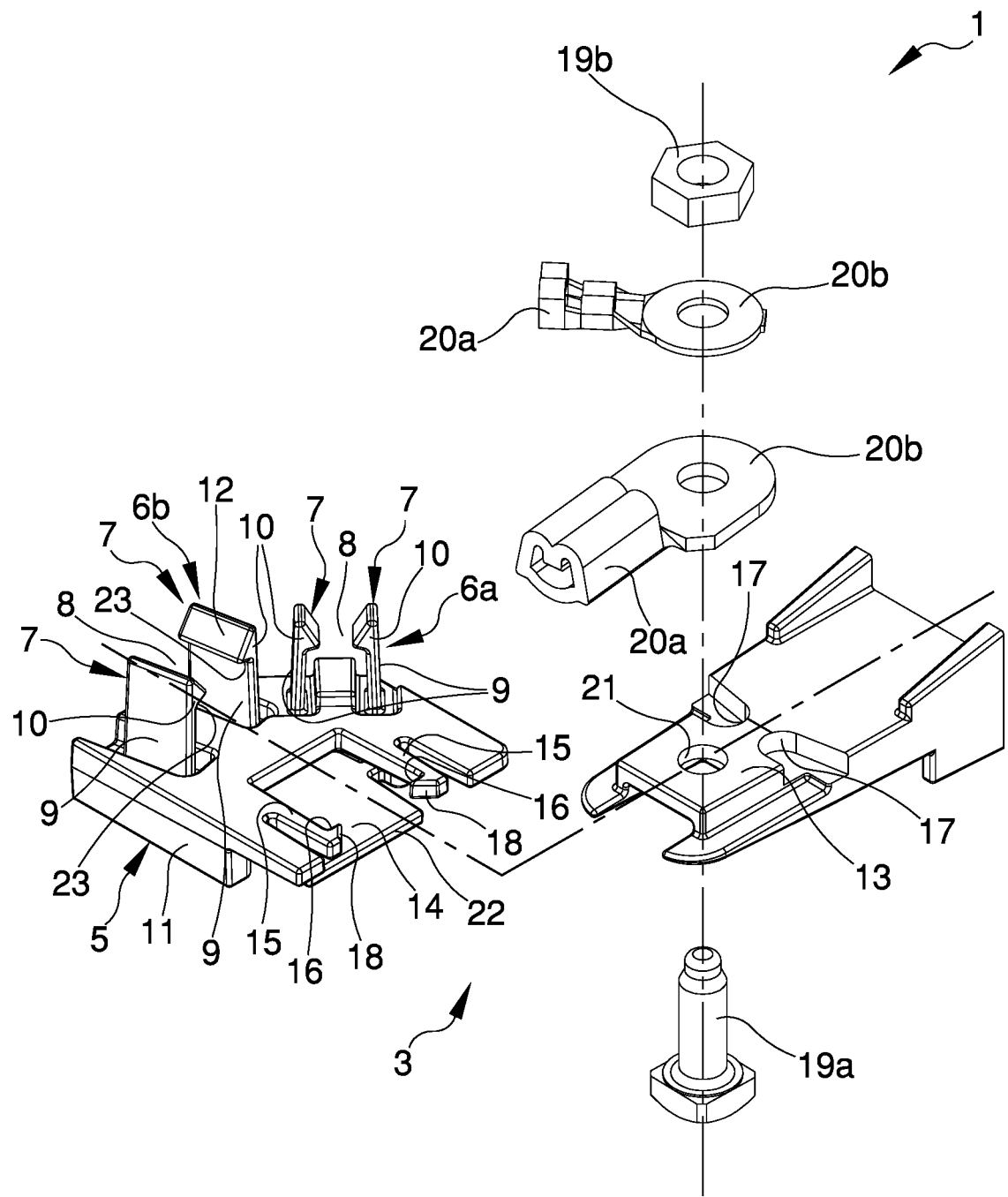
FIG. 5 is an exploded view of the battery charger according to the invention.

In particular, the through hole 21 is made at the interlocking body 13 passing from side to side thereof, as shown in FIG. 5.

The threaded body 19a, on the other hand, is preferably a clamping screw which is adapted to be screwed inside the through hole 21 so as to protrude from the connector 3.

Preferably, the supporting element 22 is a flat portion associated with the supporting body 11 which extends laterally starting from the latter substantially parallel and opposed to the elastic bodies 15.

In particular, the supporting element 22 is equidistant from the elastic bodies 15 by a predefined distance.

In this way, when the retaining means 5 are attached to the connector 3, the supporting element 22 is arranged underneath the threaded body 19a, thus preventing this from coming out of the through hole 21.

It has in practice been found that the described invention achieves the intended objects.

In particular, the retaining means allow limiting the movements of the electrical cable, especially during the installation of the same, thus maintaining an optimal electrical connection.

In addition, the presence of a plurality of elastic means allows a plurality of electrical cables to be connected.

Furthermore, the attachment means of the retaining devices to the connector make it possible to easily replace the elastic locking means, for example in the event of an elastic element should become damaged, without making it necessary to replace the entire connector.

The invention claimed is:

1. A battery charger for electric or hybrid motor vehicles, the battery charger comprising:
   at least one container body installable on a motor vehicle and defining at least one housing compartment, said container body comprising at least one grounding connector to be connected to at least one grounding electrical potential by means of at least one electrical grounding cable; and
   at least one electronic appliance housed inside said housing compartment, connectable to at least one electric battery of said motor vehicle and configured to recharge said battery;
   wherein said connector comprises at least one electrical connecting element of said electrical grounding cable and at least one connecting terminal, which can be coupled in a removable manner to said connecting element and electrically associable with said electrical grounding cable,
   wherein said connecting element comprises a threaded body and a nut screw body that can be screwed to said threaded body to fix said connecting terminal thereto,
   wherein said connector comprises retaining means of said electrical grounding cable adapted to block the position of said grounding cable during the fixing of said connecting terminal to said threaded body by said nut screw, and wherein said retaining means comprise elastic locking means for locking said electrical grounding cable, said elastic locking means comprising a pair of elastic elements arranged substantially opposed to each other to define a clamping mouth and elastically deformable away from each other to allow the insertion of said electrical cable inside said clamping mouth, said elastic elements coming to approach each other elastically to prevent said electrical cable from coming out of said clamping mouth.

2. The battery charger according to claim 1, wherein said connecting terminal is provided with a first fixing end fixed to said electrical grounding cable, and a second fixing end fixed to said threaded body.

3. The battery charger according to claim 1, wherein said retaining means comprise a plurality of elastic locking means, said plurality of elastic locking means being adapted to fix the position of a plurality of electrical grounding cables.

4. The battery charger according to claim 2, wherein said first fixing end is a clamp mechanically fixed to the conductor wire or wires of said electrical cable, and said second fixing end is a clamping ring fitted along said threaded body.

5. The battery charger according to claim 1, wherein at least one of said elastic locking means defines a clamping mouth of greater or smaller size than a clamping mouth defined by other elastic locking means so as to lock electrical grounding cables of greater or smaller size, respectively.

6. The battery charger according to claim 1, wherein said elastic element comprises at least one elongated portion and at least one extremal locking portion associated with said elongated portion and arranged protruding towards the inside of said clamping mouth, the extremal portions of said pair of elastic elements being arranged substantially opposed to each other extending the one towards the other and interlocking said electrical cable after the same is inserted inside said clamping mouth.

7. The battery charger according to claim 6, wherein said extremal portion comprises at least one inclined surface converging towards the inside of said clamping mouth defining the mouthpiece thereof, said inclined surface being adapted to be pressed so as to facilitate the insertion of the electrical grounding cable inside said clamping mouth and in such a way as to cause the elastic deformation of said elastic elements.

8. The battery charger according to claim 6, wherein said extremal portion comprises at least one abutment surface facing towards the inside of said clamping mouth and adapted to abut against said electrical cable housed inside said clamping mouth, preventing this from being extracted.

9. The battery charger according to claim 1, comprising removable attachment means of said retaining means to said connector.

10. The battery charger according to claim 9, wherein said attachment means comprise at least one interlocking body made on one of said connector and said retaining means and at least one interlocking groove made on the other of said connector and said retaining means which is adapted to mate by interlocking with said interlocking body.

11. The battery charger according to claim 10, wherein said interlocking groove comprises at least one pair of elastic bodies arranged substantially opposed to each other and elastically deformable away from each other to allow the interlocking of said interlocking body inside said interlocking groove, said elastic bodies coming to approach each other elastically to prevent said interlocking body from coming out of said interlocking groove.

12. The battery charger according to claim 1, comprising removable fixing means of said connecting element to said connector.

13. The battery charger according to claim 12, wherein said fixing means comprise:
  at least one through hole made on at least one of said connector and said retaining means, said connecting element being inserted inside said through hole; and
  at least one supporting element made on the other of said connector and said retaining means and adapted to support said connecting element inserted inside said through hole, said supporting element preventing said connecting element from coming out of said through hole when said retaining means are fixed to said connector through said attachment means.

* * * * *